INVENTOR.
ROBERT K. NELSON
BY Frank R. Decker Jr.
ATTORNEY.

United States Patent Office 3,234,048
Patented Feb. 8, 1966

3,234,048
MODULAR PANEL ASSEMBLIES FOR USE IN THERMOELECTRIC GENERATORS

Robert K. Nelson, North Syracuse, N.Y., assignor to Carrier Corporation, Syracuse, N.Y., a corporation of Delaware Filed May 18, 1961, Ser. No. 110,929
5 Claims. (Cl. 136—4)

This application relates to thermoelectric generators and, more particularly, to an improved thermoelectric panel construction for use in thermoelectric generators.

The encouraging results of the continuing search for improved thermoelectric materials and the need for compact power generators has heightened interest in thermoelectric constructions adapted to utilize a conveniently available heat source and a heat sink for the generation of electric power. Thermoelectric generators are of particular interest for use aboard submarines where their inherently quiet mode of operation is desirable. In such applications, sea water forms a convenient heat sink and heat in the form of steam or hot fluids may be readily available from a reactor or a fuel oil burner. In addition, a thermoelectric generator may be utilized as an emergency power supply for hospitals or in remote or isolated regions where electricity is not available.

Difficulty is frequently experienced, however, in the design of a practical thermoelectric module for use in a generator due to relatively high expansion and contraction of the hot side of a thermoelectric panel and associated fastening means adapted for use in a power generator. Since thermoelectric elements are characteristically fragile and unable to withstand severe shear stresses, it is apparent that injury to the thermoelectric panel or module may result from thermally generated forces exerted thereon. Because of the problems encountered in providing a soldered or brazed joint between the thermoelectric elements and their associated conductor straps on the hot side of the thermoelectric panel, it is frequent practice to employ a pressure contact to form the necessary electrical connection. Pressure plates are, therefore, utilized to retain the thermoelectric elements in contact with the conductor straps on the hot side of the panel and fastening means are utilized to hold the pressure plates in position and to provide the necessary force to hold the thermoelectric elements in contact with the conductor straps. However, the fastening means frequently tend to expand when heated thereby relieving the pressure which must be exerted by the pressure plates. A poor or broken contact between the thermoelectric elements and the conductor straps on the hot side of the thermoelectric panel frequently results from this expansion of the fastening means. These problems become especially severe when the thermoelectric panel is required to be cycled on and off and wherein the temperature differentials across the thermoelectric panel vary from time to time as is encountered in practical applications.

Accordingly, it is the principal object of this invention to provide a thermoelectric panel construction which is adapted to withstand the effects of thermally generated forces.

This and other objects of this invention are achieved in the illustrated preferred embodiment thereof by the provision of a plurality of suitably connected thermoelectric elements and conductor straps which are insulated from, and retained between, a pair of generally parallel pressure plates. Thermoelectric junctions which are to be heated are formed by a pressure contact between the thermoelectric elements and their associated conductor straps, and are disposed adjacent to one of the pressure plates. The thermoelectric junctions which are to be cooled are formed by soldering the thermoelectric elements to other conductor straps which are disposed adjacent to the other pressure plate. Means are provided to heat one of the pressure plates and to cool the other pressure plate. The two pressure plates are retained by suitable fastening elements which carry spherically curved portions (convex) which mate with corresponding spherically curved portions (concave) carried by the pressure plates. Resilient means cooperate with the fastening elements to compensate for thermal expansion of the fastening means or pressure plates and panel assembly in a direction along the axis of the fastening elements. The mating spherically curved portions of the fastening elements and pressure plates permit relative transverse motion of the pressure plates with respect to each other. This construction, therefore, permits the pressure plates to move in any direction with respect to each other and relieves the thermally generated forces which would otherwise tend to displace or fracture the thermoelectric elements without relieving the force exerted on the thermoelectric elements and the conductor straps by the pressure plates. Consequently, the adverse effects of expansion forces generated by cycling or varying temperature differentials across the thermoelectric panel assemblies are minimized and the thermoelectric generator is enabled to function effectively under practical operating conditions.

These and other objects of this invention will become more apparent by reference to the following specification and attached drawing wherein.

Figures 1, 2:
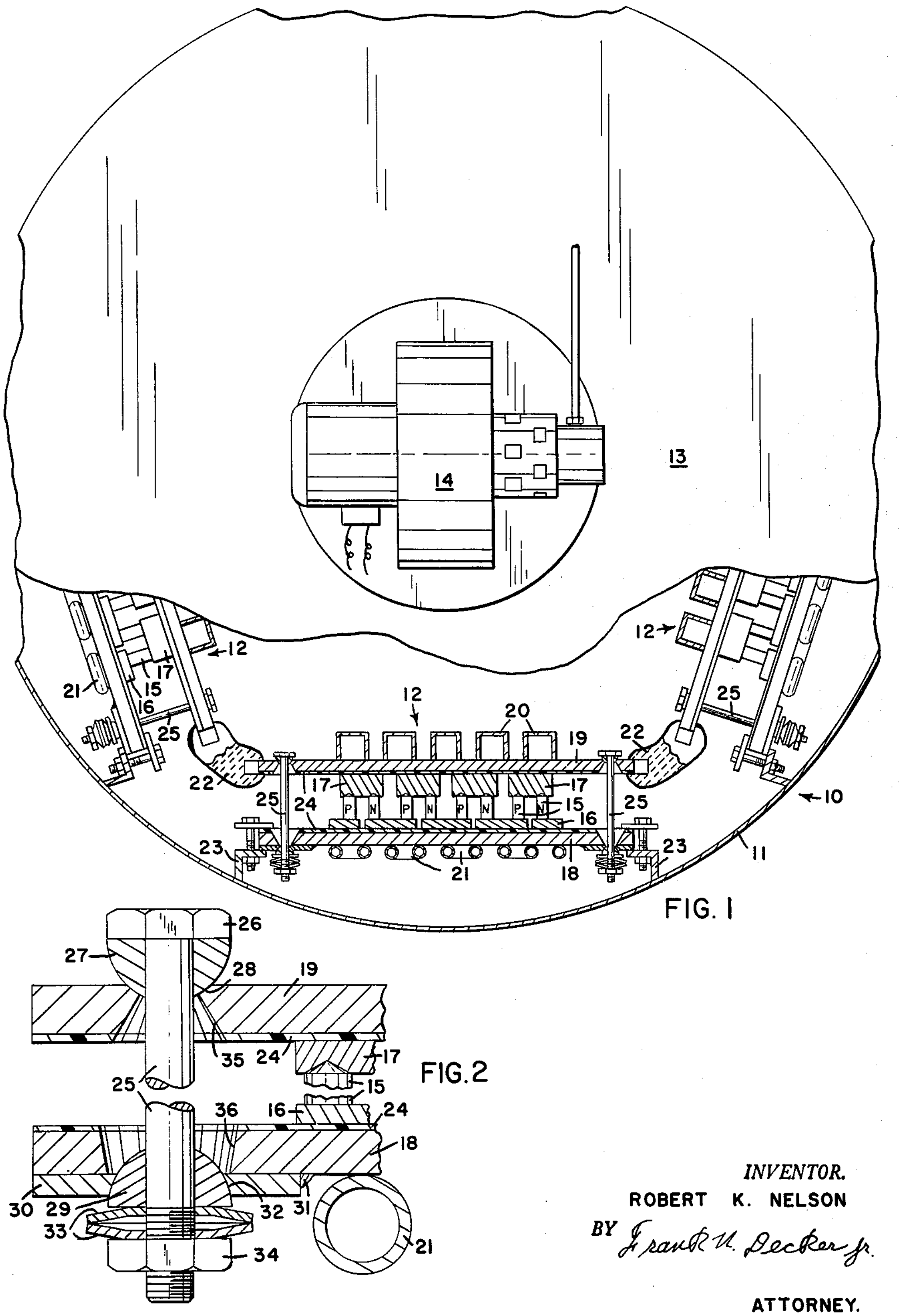
FIGURE 1 is a cross-scetional view partly broken away through a thermoelectric generator in accordance with this invention.
FIGURE 2 is a detailed cross-sectional view through a portion of a thermoelectric panel illustrating one of the fastening elements.

Referring to FIGURE 1, there is shown a thermoelectric generator 10 having an outer shell 11 with a plurality of thermoelectric modules or panel assemblies 12 disposed therein. A top shell 13 carries a burner heat source 14 for supplying heat to the interior of the thermoelectric generator.

Burner heat source 14 may be an oil burner which supplies an ignited mixture of fuel and air into the interior of the thermoelectric generator and heats the thermoelectric panel assembly by direct radiation from the burner. It will be understood, however, that the heat source shown is merely illustrative of a number of suitable heat sources. For example, a suitable source of high pressure steam or other hot fluid from a reactor may be supplied either directly or indirectly in heat exchange relation with the thermoelectric panels in the interior of generator 10. In like manner, while the thermoelectric panels have been illustrated as forming a polygonal configuration within an outer shell 11, various other constructions may be utilized depending upon the heat source utilized and other factors such as the available space in which the generator is to be located.

Thermoelectric modules or panels 12 comprise a plurality of thermoelectric elements 15 having dissimilar thermoelectric properties suitably connected by spaced electrically conductive conductor straps 16 and 17 in alternating series relation. Thermoelectric elements 15 are desirably suitable semi-conductor thermolectric elements of alternating P and N-type conductivity. For example, the P-type materials may be lead telluride containing small amounts of a suitable doping agent such as lead to impart N-type conductivity thereto. The P-type elements may comprise lead telluride with sodium as a doping agent therein. The thermoelectric elements are arranged in the panel assembly substantially parallel to each other and are electrically connected by conductor straps 16 and 17. Conductor straps 16 join N-type elements to P-type elements and form the thermoelectric junctions or thermal couples of the type adapted to be cooled. Conductor straps 17 connect P-type elements to N-type elements and form thermoelectric junctions of the type adapted to be heated which are spaced from the cooled junctions for the generation of electrical power.

A suitable insulating material such as mica is provided to electrically insulate conductor straps 16 and 17 from spaced pressure plates 18 and 19 respectively, between which the thermoelectric elements and conductor straps are disposed. It will be appreciated that the insulation sheet 24, which is disposed adjacent to conductor straps 17 and pressure plate 19 must have suitable high temperature electrically insulating characteristics and, desirably, this insulation sheet is relatively thin and presents a relatively low thermal resistance heat conducting path between pressure plate 19 and conductor straps 17. The sheet of electrical insulation adjacent to conductor straps 16 and thermoelectric panel 18, adapted to be cooled, may be of the same or a different material and is not required to withstand as high a temperature as the insulation adjacent the panel to be heated. However, it is also desirable that this sheet of electrical insulation provide a relatively low thermal resistance heat conducting path between pressure plate 18 and conductor straps 16 for efficient operation of the thermoelectric generator.

In the generator shown in FIGURE 1, ducts 20 are formed along the interior edge of thermoelectric panel 19 to conduct flue gases from burner heat source 14 to a suitable flue. This construction enables heat to be transferred from the heat source to hot pressure plate 19 by both direct radiation from the burner and by convective heat transfer with the flue gases passing upwardly through ducts 20. Similarly, pipes 21 are disposed in heat transfer relation with cold pressure plate 18 and form passages for cooling water which is to be passed in heat exchange relation with conductor straps 16, forming the thermoelectric junctions which are required to be cooled during operation of the generator.

Suitable retaining supports 23 position and retain the thermoelectric panel assemblies 12 at the desired location within generator shell 11. Supports 23 may be secured to pressure plate 18 and may be welded or otherwise fastened to shell 11 for this purpose. Suitable sealing gaskets 22 may be disposed in sealing relation with hot pressure plates 19 and are preferably of a flexible insulating material which is resistant to the temperatures existing in the interior of the thermoelectric generator. The remaining space between pressure plates 18 and 19 and between sealing gaskets 22 and the wall of seal 12 may be filled with an inert gas such as nitrogen, or it may be filled with a foamed polyurethane resin if desired.

Thermoelectric elements 15 may be soldered or brazed with a suitable metal to conductor straps 16, which form the cold thermoelectric junctions. However, it is preferred practice to recess conductor straps 17 which form the hot thermoelectric junctions and to form corresponding projecting portions on the ends of thermoelectric elements 15 which contact conductor straps 17. The pressure exerted on the conductor straps and thermoelectric elements by pressure plates 18 and 19 is sufficient to retain the thermoelectric elements in electrical contact by their mating engagement with conductor straps 17 without soldering or brazing. The construction is desirable because it eliminates problems which may arise from soldering or brazing materials melting at the relatively high temperatures present at the hot thermoelectric junctions; it also eliminates degradation of the thermoelectric elements by diffusion of soldering or brazing material into the internal lattice structure of the thermoelectric elements.

It is apparent from the foregoing that it is necessary to utilize at least one and preferably four spaced fastening elements to retain pressure plates 18 and 19, in order that they may continue to exert sufficient compression to maintain the thermoelectric elements and conductor straps in contact within the thermoelectric panel. A problem, however, arises with conventional fastening constructions in that the temperature difference between pressure plates 18 and 19 may exceed 500° C. and temperature diffenences of the same order of magnitude are experienced between start-up temperature and operating temperature of the generator. Consequently, conventional fastening arrangements tend to expand with increased temperature thereby relieving the pressure on the conductor straps and thermoelectric elements. In addition, hot pressure plate 19 tends to expand in the plane thereof substantially more than relatively cold pressure plate 18. Consequently, very great thermally generated differential expansion forces are produced which are capable of shearing the fastening means or the relatively brittle thermoelectric elements if the two pressure plates are not free to move with respect to each other and their fastening means.

Accordingly, fastening means 25 comprises suitable tension elements such as bolts for tensioning the pressure plates, thereby exerting the required compressive force on the conductor straps and thermoelectric elements to retain them in position and to assure good electrical contact with conductor straps 17. As best shown in FIGURE 2, the fastening elements may comprise a bolt having a suitable head 26 for retaining a washer 27 having a spherically curved portion thereon. Washer 27 is formed with an aperture through its central portion to enable it to be slid over the shank of fastening element 25. It will be understood, however, that instead of forming a separate washer, that a bolt having a spherically curved portion on its head may be utilized instead. A spherically curved portion 28 is formed by milling pressure plate 19 which is adjacent and in heat exchange relation with the thermoelectric junctions to be heated. Pressure plate 19 and washer 27 may desirably be formed of stainless steel. A conical portion 35 flares inwardly of thermoelectric panel 12 from spherically curved portion 28 of pressure plate 19. Conical portion 35 serves to allow movement of the shank of fastening means 25 throughout a substantial arc in any direction. Spherically curved portion 28 is concave and mates with the convexly formed spherical portion of washer 27 to form a joint to allow movement therebetween.

Pressure plate 18, which is adjacent the thermoelectric junctions to be cooled may be made of copper or other soft metal, which is not as well suited for forming a bearing surface as is the stainless steel, of which pressure plate 19 may be made. A conical portion 36 is formed in pressure plate 18 to allow movement of the shank of fastening means 25. A bearing plate 30 is secured by a suitable weld 31 to pressure plate 18 and a spherical portion 32 is formed in bearing plate 30. Spherically curved portion 32 is concave and mates with a correspondingly spherically curved portion on washer 29, which is slipped over the other end of fastening means 25 to form the joint. Bearing plate 30 and washer 29 may be made of a suitably hard material such as stainless steel or a copper nickel alloy. It will be appreciated that the bearing plate is unnecessary if pressure plate 18 is of a material which forms an adequate bearing surface.

In order to compensate for axial expansion of fastening means 25 when it is heated during operation of the generator, a spring means is disposed between washer 29 and a nut 34 which retains the fastening means in position and tensions the pressure plates. The spring means may desirably comprise one or more Belleville washers 33 having a sufficient range of deformation and stiffness to permit adequate pressure to be applied by nut 34 to sufficiently tension the pressure plates. At the same time, the spring means must have a range of deformation in excess of the anticipated axial thermal expansion of fastening means 25.

In operation, it will be observed that by the construction illustrated, pressure plate 19 is permitted to move with respect to pressure plate 18 without releasing the compressive force exerted on the thermoelectric elements and the conductor straps. In addition, axial thermal expansion fastening means 25 is compensated for by deflection of Belleville washers 33 so that tension is maintained on the fastening element and pressure plates in spite of thermal expansion of the nut. The spherical joint between washers 27 and 29 and their associated spherical portions carried by pressure plates 19 and 18, respectively, allow pressure plate 19 to slide on the sheet of electrical insulation between it and conductor strap 17 when pressure plate 19 is expanded by thermally generated forces.

While for purposes of illustration, a preferred embodiment of this invention has been described, it will be understood that various modifications and embodiments may be devised without departing from the scope of the following claims:

I claim:

1. A thermoelectric panel assembly for the generation of electric power comprising a pair of spaced pressure plates, a plurality of thermoelectric elements of dissimilar thermoelectric properties disposed between said pressure plates, conductor straps connecting pairs of thermoelectric elements having dissimilar thermoelectric properties to form a plurality of thermoelectric junctions of a type to be heated and a plurality of thermoelectric junctions of a type to be cooled for the generation of electric power, and fastening means extending from one of said pressure plates to the other pressure plate to compress said plates against said conductor straps and said thermoelectric elements to hold them in a desired position, said fastening means comprising a tension member having a pair of spaced spherically curved portions in engagement with mating spherically curved portions carried by each of said pressure plates to allow said pressure plates to shift with respect to each other under the influence of forces generated by thermal expansion of said assembly.

2. In a thermoelectric device for the generation of electric power, a thermoelectric panel assembly comprising a plurality of thermoelectric elements having dissimilar thermoelectric properties, said thermoelectric elements being joined by a plurality of electrically conductive conductor straps, said conductor straps joining pairs of thermoelectric elements having dissimilar properties in alternating series relation to form a plurality of thermoelectric junctions of a type adapted to be heated and a plurality of thermoelectric junctions of a type adapted to be cooled for the generation of electrical power, said junctions to be heated being spaced from the junctions to be cooled, a pair of spaced pressure plates disposed about said conductor straps and said thermoelectric elements for exerting pressure thereon, means to heat one of said thermoelectric panels adjacent the junctions to be heated, means to cool the other of said thermoelectric panels adjacent the junctions to be cooled, fastening means to retain said pressure plates in a desired relation with respect to each other, spring means cooperating with said fastening means and said pressure plates to compensate for dimensional changes thereof due to thermal expansion and to maintain pressure on said thermoelectric elements and said conductor straps, and joint means to permit said pressure plates to shift under the influence of thermally generated forces while retaining pressure on said thermoelectric elements and said conductor straps, said joint means comprising spherical portions on said fastening means in mating engagement with correspondingly mating spherical portions carried by each of said pressure plates.

3. A thermoelectric panel assembly comprising a plurality of thermoelectric elements having dissimilar thermoelectric properties, a plurality of conductor straps connecting dissimilar thermoelectric elements to form a plurality of conductor straps to be heated spaced from a plurality of conductor straps to be cooled, said thermoelectric elements and conductor straps being disposed between and insulated from a pair of spaced pressure plates, fastening means to retain said pressure plates together, said fastening means being free to move with respect to said pressure plates and being provided with a spherically shaped portion mating with a correspondingly spherically shaped portion carried by said pressure plates to permit differential thermal expansion between said pressure plates.

4. A thermoelectric panel assembly as defined in claim 3 including a bearing plate secured to one of said pressure plates, said bearing plate having formed thereon the spherically shaped portion carried by said pressure plate.

5. A thermoelectric panel as defined in claim 3 including spring means associated with said fastening means for retaining pressure on said thermoelectric elements and said conductor straps irrespective of dimensional changes caused by thermal expansion.

References Cited by the Examiner

UNITED STATES PATENTS

| | | | |
|---|---|---|---|
| 2,978,875 | 4/1961 | Lackey | 136—4 |
| 2,992,538 | 7/1961 | Poganski | 136—4 |

ALLEN B. CURTIS, *Primary Examiner.*

DAVID X. SLINEY, *Examiner.*